(12) United States Patent
Kim et al.

(10) Patent No.: US 7,843,539 B2
(45) Date of Patent: Nov. 30, 2010

(54) THIN FILM TRANSISTOR SUBSTRATE AND LIQUID CRYSTAL DISPLAY HAVING THE SAME

(75) Inventors: Dong-Gyu Kim, Yongin-si (KR); Dong-Yoon Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 97 days.

(21) Appl. No.: 12/265,196

(22) Filed: Nov. 5, 2008

(65) Prior Publication Data

US 2009/0122248 A1  May 14, 2009

(30) Foreign Application Priority Data

Nov. 13, 2007  (KR) ............... 10-2007-0115292

(51) Int. Cl.
  *G02F 1/1343*  (2006.01)
  *H01L 27/088*  (2006.01)
(52) U.S. Cl. ............. 349/139; 349/141; 349/142; 257/59; 257/E27.06
(58) Field of Classification Search ............ 349/141, 349/56, 78, 81, 82, 83, 139, 140, 142, 143, 349/146, 149, 38, 39, 42, 104, 106; 257/59, 257/E27.06
See application file for complete search history.

(56) References Cited

U.S. PATENT DOCUMENTS

| | | | |
|---|---|---|---|
| 6,816,383 B2 * | 11/2004 | Barringer et al. | 361/759 |
| 7,016,006 B2 * | 3/2006 | Song | 349/146 |
| 7,515,237 B2 * | 4/2009 | Park et al. | 349/141 |
| 2002/0180900 A1 * | 12/2002 | Chae et al. | 349/43 |
| 2006/0125989 A1 * | 6/2006 | Park et al. | 349/141 |
| 2009/0122248 A1 * | 5/2009 | Kim et al. | 349/139 |

* cited by examiner

*Primary Examiner*—Brian M Healy
(74) *Attorney, Agent, or Firm*—Cantor Colburn LLP

(57) ABSTRACT

A thin film transistor ("TFT") substrate includes: gate lines extending along a first direction; data lines extending along a second direction intersecting the first direction; and a pixel electrode formed to extend at an angle from a first gate line toward a second gate line adjacent to the first gate line. A portion of the pixel electrode at least partially overlaps a portion of the second gate line. Each data line includes a source electrode and a drain electrode spaced apart from the source electrode.

20 Claims, 12 Drawing Sheets

THIN FILM TRANSISTOR SUBSTRATE AND LIQUID CRYSTAL DISPLAY HAVING THE SAME

This application claims priority to Korean Patent application No. 10-2007-0115292, filed on Nov. 13, 2007, and all the benefits accruing therefrom under 35 U.S.C. §119, the contents of which in its entirety are herein incorporated by reference.

BACKGROUND OF THE INVENTION

1. Field of the Invention

The present invention relates to a liquid crystal display (hereinafter referred to as an "LCD"), and more particularly, to a thin film transistor substrate including pixels arranged in an abscissa direction, e.g., a horizontal direction, thereby improving an aperture ratio and a transmittance of an LCD including the thin film transistor substrate.

2. Description of the Related Art

An LCD typically includes a lower substrate having gate lines, data lines, pixel electrodes and thin film transistors ("TFTs") disposed thereon, an upper substrate including a common electrode disposed thereon, and a liquid crystal layer interposed between the upper substrate and the lower substrate. In the LCD, an electric field is generated between the upper substrate and the lower substrate by applying a voltage to the pixel electrode and the common electrode. Thus, an image is displayed on the LCD based on an orientation of liquid crystal molecules in the liquid crystal layer and a polarization of incident light.

To increase a resolution of the LCD, a number of data lines and a number of gate lines are increased. However, when the number of data lines is increased, a number of corresponding data driving integrated circuits ("ICs") which apply image signals to the data lines is also increased, and thus a size of the LCD is increased.

Therefore, an LCD having increased resolution, but with a reduced number of data driving ICs, has been suggested to reduce the size of the LCD while maintaining high resolution. However, since the number of gate driving ICs is still increased, a gate IC integration ("GII") method for integrating gate driving ICs on a panel is generally utilized in the LCD having the reduced number of data driving ICs. Further, pixels in the LCD are typically arranged in an abscissa direction, e.g., a horizontal direction, to arrange the increased gate lines in an efficient manner. In addition, a pixel of the LCD is generally divided into at least two pixels, e.g., sub-pixels, further divided into a plurality of domains.

Thus, as an area of an LCD having the pixels arranged in the abscissa direction is increased, an aperture ratio and a transmittance thereof are substantially increased. In contrast, as the area of the LCD is decreased, the aperture ratio and transmittance thereof are remarkably reduced. For example, a typical 27-inch LCD has an aperture ratio of 54.2% and a transmittance of 4.73, while a 16-inch LCD has an aperture ratio of 35.5% and a transmittance of 3.09. Therefore, small- or medium-sized LCDs of the prior art having pixels arranged in the abscissa direction have a lowered display capability.

BRIEF SUMMARY OF THE INVENTION

The present invention provides a liquid crystal display ("LCD") having pixels arranged in an abscissa direction, e.g., a horizontal direction, thereby improving an aperture ratio and a transmittance in a middle/small sized LCD.

The present invention further provides an LCD wherein pixel electrodes are formed in a chevron shape including a bent portion, and gate lines are formed to overlap with cutout portions of a common electrode, thereby improving an aperture ratio of the LCD.

The present invention further provides an LCD wherein a pixel electrode overlaps an adjacent gate line, and a first side of the pixel electrode is formed to overlap with a data line, thereby preventing an increase in a kickback voltage and maintaining a constant parasitic capacitance between the data line and the pixel electrode.

According to an exemplary embodiment of the present invention, there is provided a thin film transistor ("TFT") substrate, which includes gate lines extending along a first direction; data lines extending along a second direction intersecting the first direction, each of the data lines including a source electrode and a drain electrode spaced apart from the source electrode; and pixel electrodes, each of the pixel electrodes bent to extend at an angle from a first gate line to a second gate line adjacent to the first gate line, a portion of the pixel electrode being formed to overlap a portion of the second gate line.

The portion of the second gate line includes a bent pattern.

According to an exemplary embodiment, the bent pattern includes a bent portion bent at approximately the same angle at which the pixel electrode extends from the first gate line toward the second gate line.

A first side of the pixel electrode may at least partially overlap a drain electrode of a first data line and a second side of the pixel electrode, opposite the first side, may overlap at least a portion of a second data line adjacent to the first data line.

At least one of the first data line and the second data line may include a protrusion which overlaps at least a portion of the pixel electrode.

The protrusion may include protruding patterns disposed along the second direction on alternating opposite sides of the at least one of the first data line and the second data line.

The TFT substrate may further include a gate insulating layer formed between a data line and at least one of the first gate line and the second gate lines; and a protective layer formed between the data line and the pixel electrode.

The TFT substrate may further include a storage electrode line formed parallel to the data line in a same layer as the data line; and a storage electrode connected to the storage electrode line to overlap at least a portion of the pixel electrode.

In an alternative exemplary embodiment of the present invention, the TFT substrate may include a storage electrode extending from at least one of the first the gate line and the second gate line and which overlaps at least a portion of the pixel electrode.

A portion of the protective layer disposed above the storage electrode may be removed.

The protective layer may include one of an organic layer and a color filter.

A width of a gap between adjacent data lines may be greater than a width of a gap between the first gate line and the second gate line.

According to an alternative exemplary embodiment of the present invention, there is provided an LCD, which includes a first substrate. The first substrate includes: gate lines extending along a first direction; data lines extending along a second direction, intersecting the first direction, each of the data lines including a source electrode and a drain electrode spaced apart from the source electrode; and a pixel electrode bent to extend at an angle from a first gate line to a second gate line adjacent the first gate line, and a portion of which at least partially overlaps the at least a portion of the second gate line. The LCD according to an exemplary embodiment further includes a second substrate formed to face the first substrate and including a common electrode disposed thereon, and a liquid crystal layer formed between the first substrate and the second substrate.

A cutout portion may be formed in the common electrode, and a width of the cutout portion may be less than a width of the pixel electrode and may be bent to correspond to a shape of the pixel electrode. The gate line may include a bent portion corresponding to the cutout portion.

A first side of the pixel electrode may overlap at least a portion of a drain electrode of a first data lines, and a second side of the pixel electrode, opposite the first side, may overlap at least a portion of a second data lines adjacent to the first data line.

At least one of the first data line and the second data line includes a protrusion which overlaps at least a portion of the pixel electrode, the protrusion comprising protruding patterns disposed along the second direction on alternating opposite sides of the at least one of the first data line and the second data line.

The LCD may further include: a gate insulating layer formed between at least one of the first gate line and the second gate line and at least one of the first data line and the second data line; and a protective layer formed between the at least one of the first data line and the second data line and the pixel electrode.

The LCD may further include a storage electrode line formed parallel to the at least one of the first data line and the second data line in the same layer as the at least one of the first data line and the second data line; and a storage electrode connected to the storage electrode line to overlap at least a portion of the pixel electrode.

In an alternative exemplary embodiment, the LCD may further include a storage electrode extending from the at least one of the first gate line and the second gate line to overlap at least a portion of the pixel electrode.

A portion of the protective layer disposed above the storage electrode may be removed.

The protective layer may include one of an organic layer and a color filter.

A width of a gap between adjacent data lines is greater than a width of a gap between the first gate line and the second gate line.

BRIEF DESCRIPTION OF THE DRAWINGS

The above and other aspects, features and advantages of the present invention will become more readily apparent by describing in further detail exemplary embodiments thereof with reference to the accompanying drawings, in which.

DETAILED DESCRIPTION OF THE INVENTION

Figure 1:
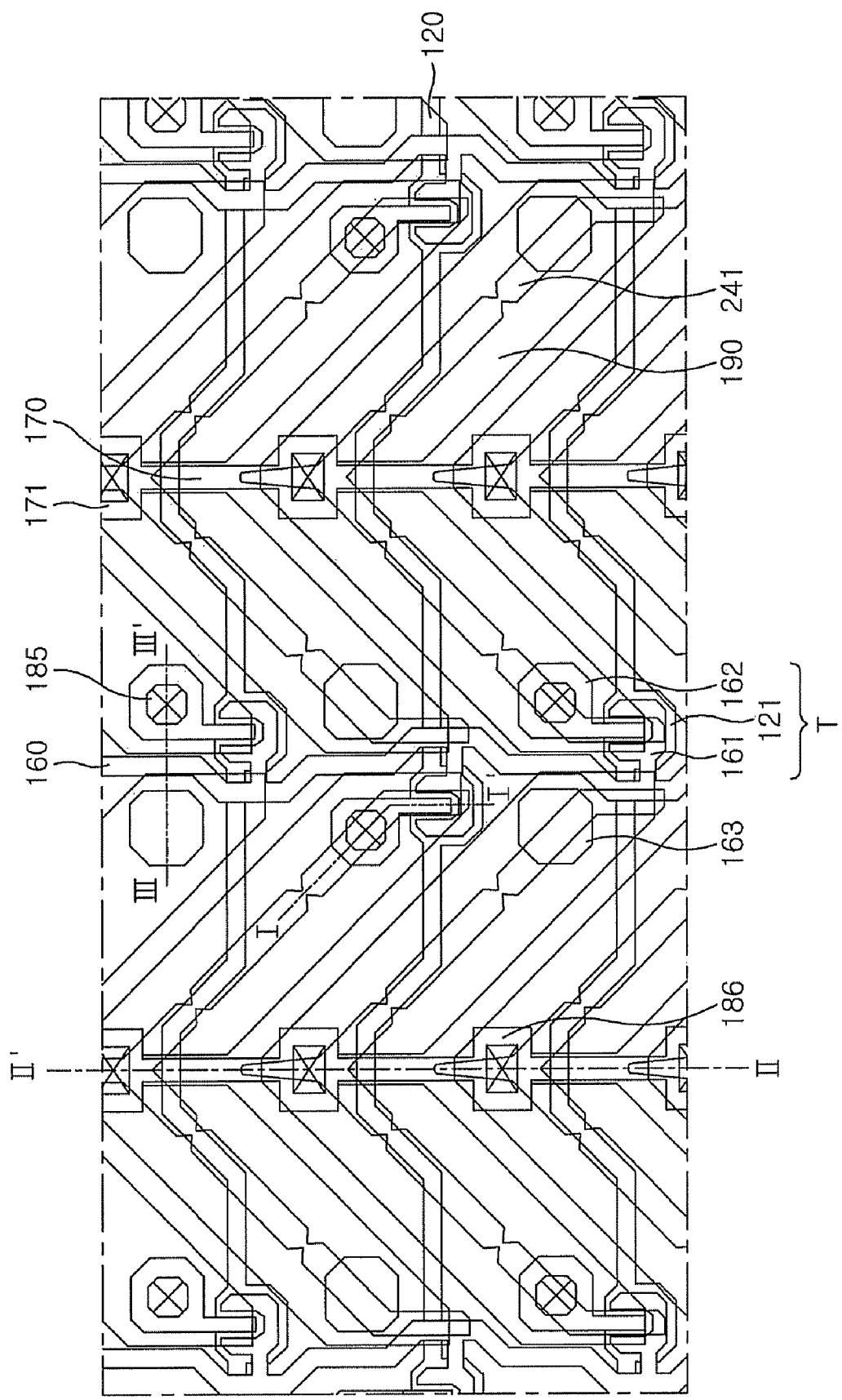
FIG. 1 is a plan view of a liquid crystal display ("LCD") panel according to an exemplary embodiment of the present invention.

The invention will now be described more fully hereinafter with reference to the accompanying drawings, in which exemplary embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements. The exemplary term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

Hereinafter, exemplary embodiments of the present invention will be described in further detail with reference to the accompanying drawings.

Figure 2:
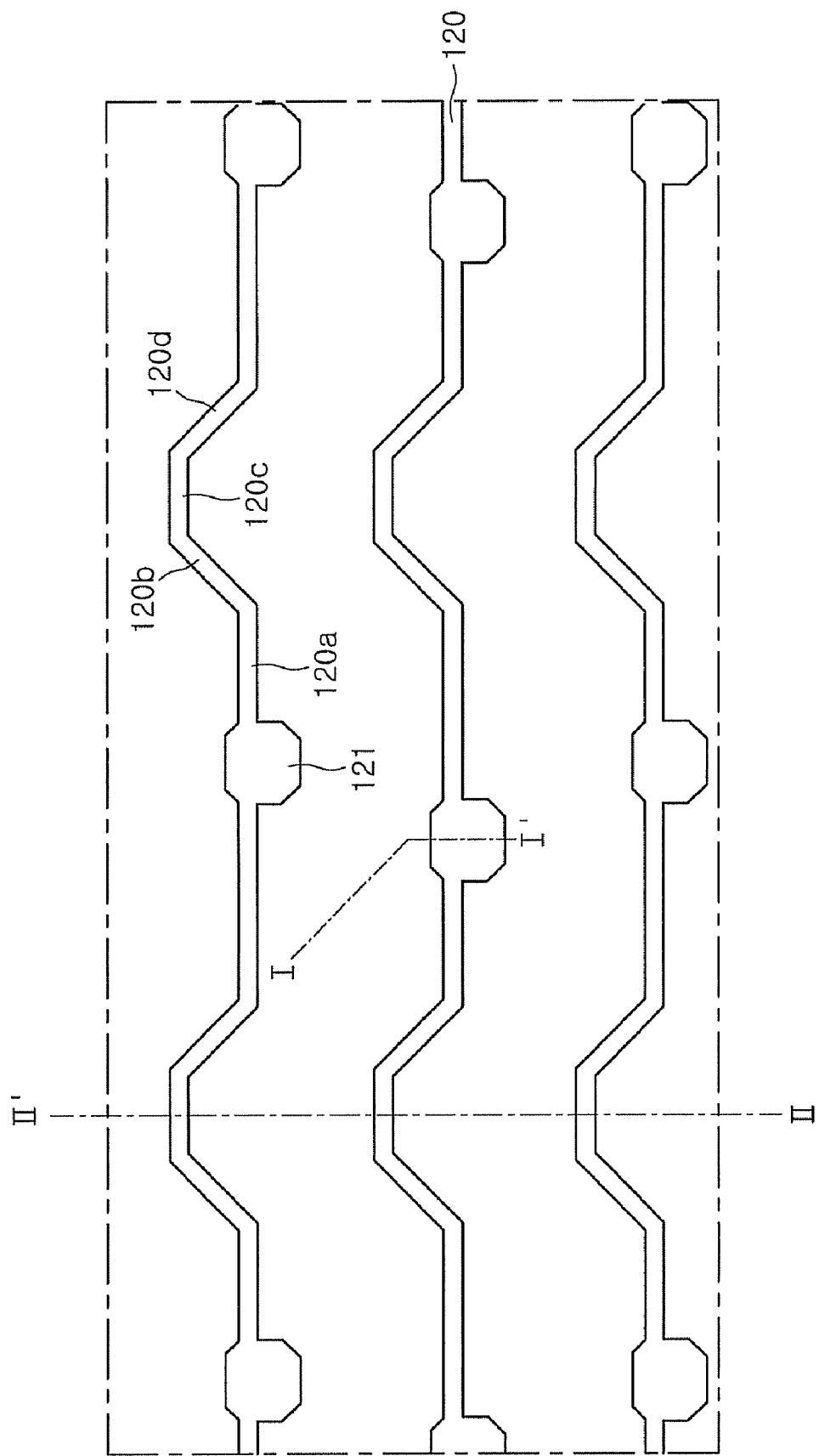
FIG. 2 is a plan view showing gate lines of the LCD according to the exemplary embodiment shown in FIG. 1.
Figure 3:
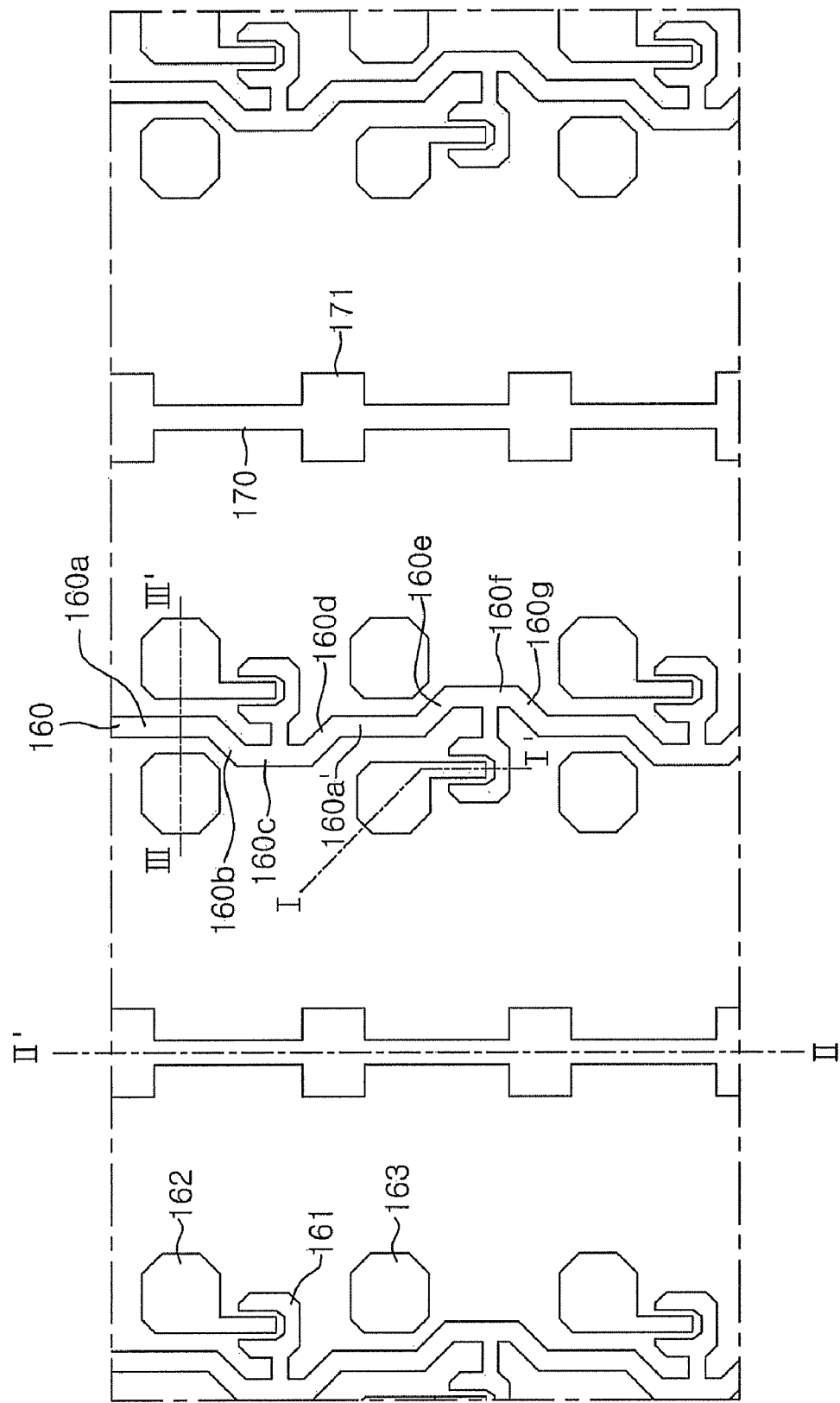
FIG. 3 is a plan view showing data lines and storage electrode lines of the LCD according to the exemplary embodiment shown in FIG. 1.
Figure 4:
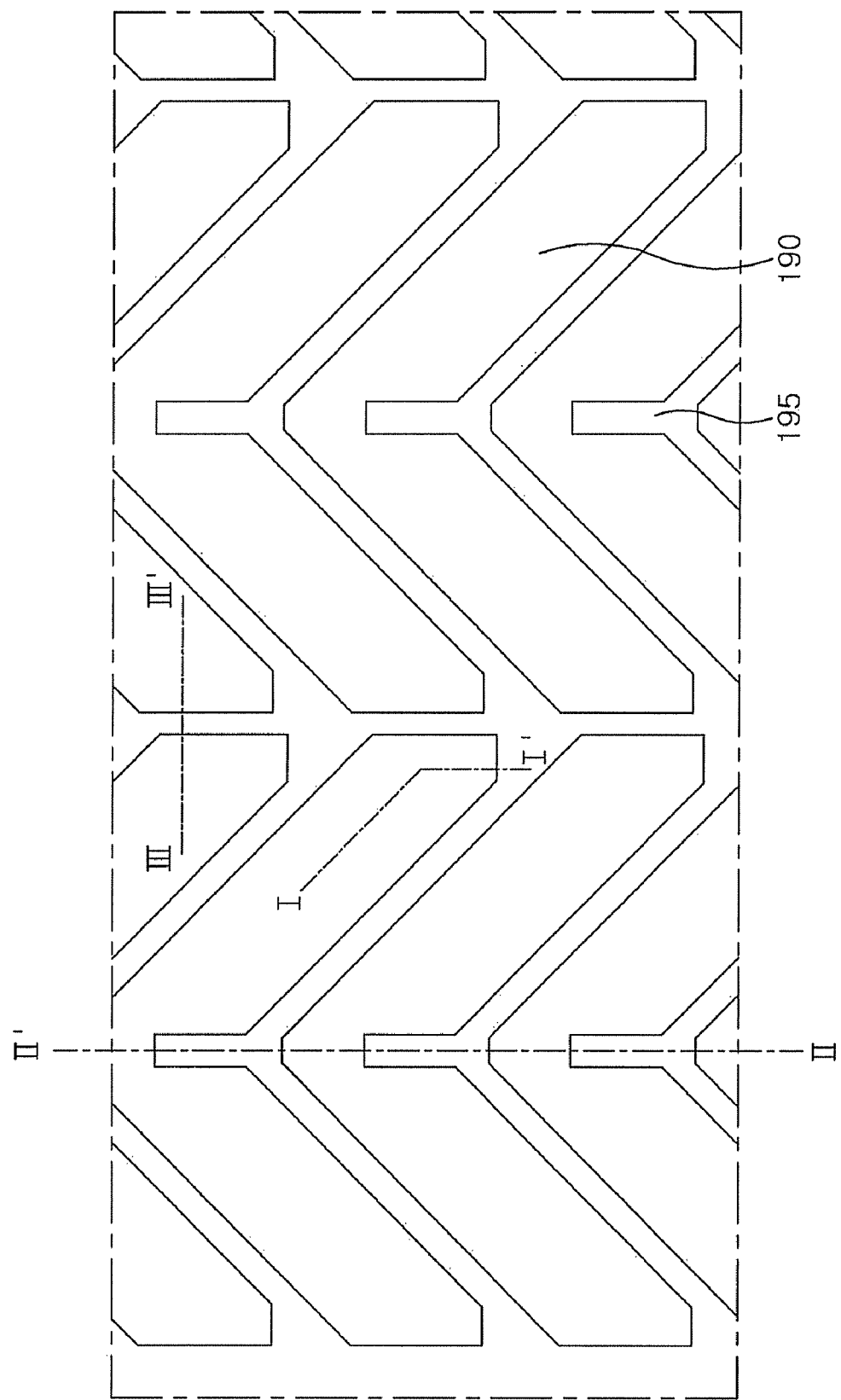
FIG. 4 is a plan view showing pixel electrodes of the LCD according to the exemplary embodiment shown in FIG. 1.
Figure 5:
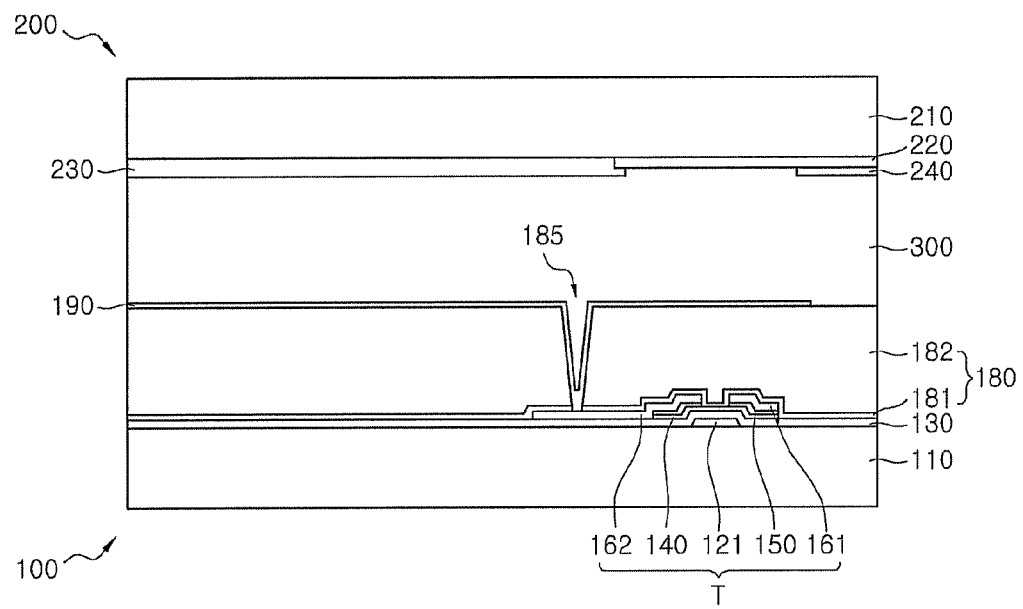
FIG. 5 is a partial cross-sectional view taken along line I-I' in FIG. 1.
Figure 6:
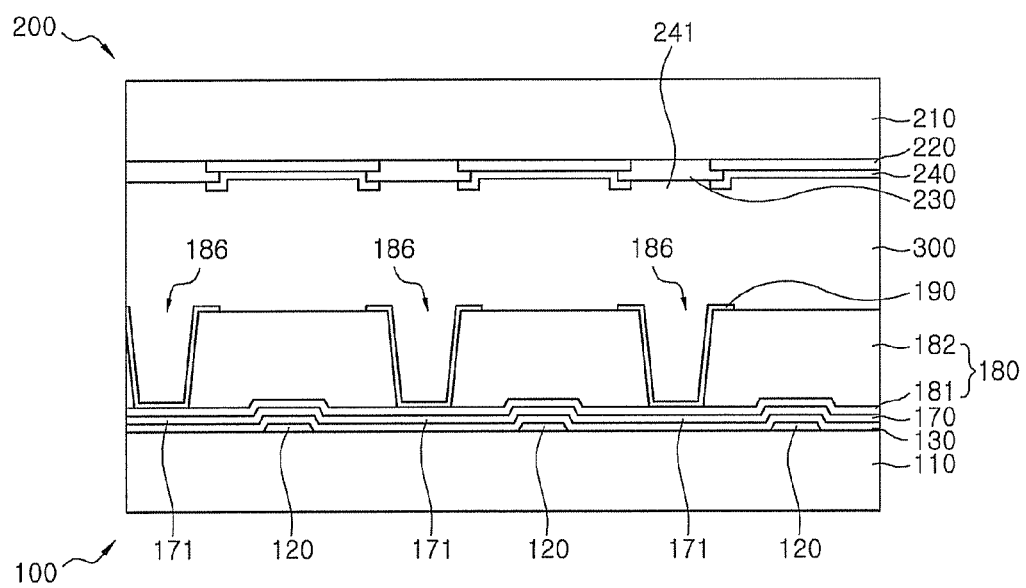
FIG. 6 is a partial cross-sectional view taken along line II-II' in FIG. 1.
Figure 7:
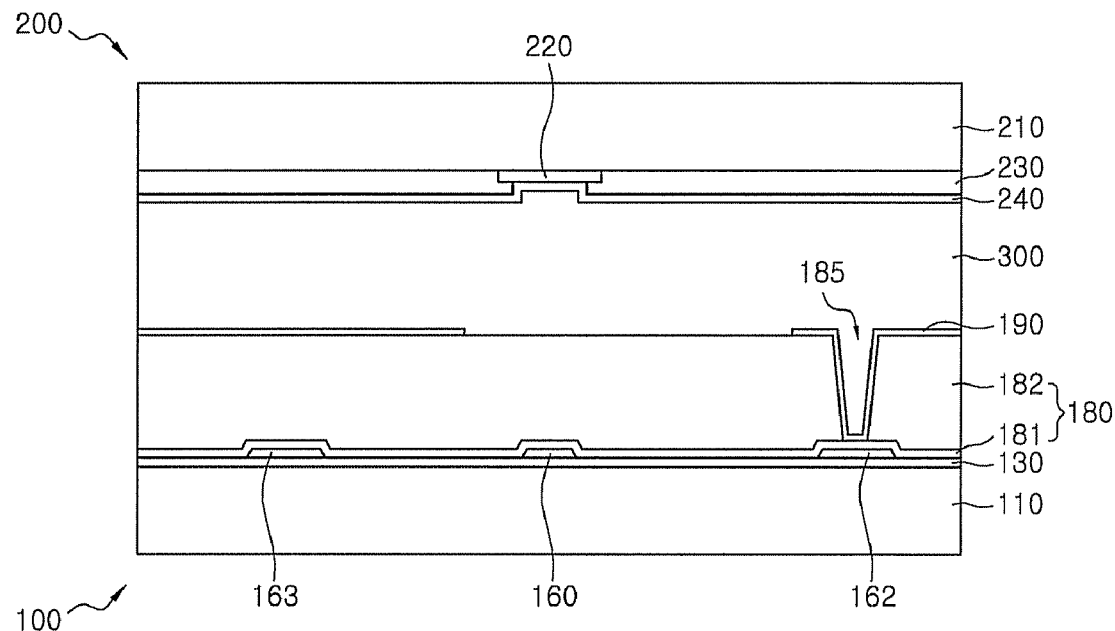
FIG. 7 is a partial cross-sectional view taken along line III-III' in FIG. 1.

FIG. 1 is a plan view of a liquid crystal display ("LCD") panel according to an exemplary embodiment of the present invention. FIG. 2 is a plan view showing gate lines of the LCD according to the exemplary embodiment shown in FIG. 1, FIG. 3 is a plan view showing data lines and storage electrode lines of the LCD according to the exemplary embodiment shown in FIG. 1, and FIG. 4 is a plan view showing pixel electrodes of the LCD according to the exemplary embodiment shown in FIG. 1. FIG. 5 is a partial cross-sectional view taken along line I-I' in FIG. 1, FIG. 6 is a partial cross-sectional view taken along line II-II' in FIG. 1, and FIG. 7 is a partial cross-sectional view taken along line III-III' in FIG. 1.

Referring to FIGS. 1 to 7, an LCD panel according to an exemplary embodiment of the present invention includes a lower substrate 100 including gate lines 120, data lines 160 and thin film transistors ("TFTs") T formed thereon, an upper substrate 200 including a common electrode 240 formed thereon, and a liquid crystal layer 300 interposed between the lower substrate 100 and the upper substrate 200.

The lower substrate 100 includes a plurality of the gate lines 120 extending substantially in a first direction on a first insulating substrate 110, each gate line 120 having a predetermined bent pattern (see FIG. 2). The lower substrate 100 further includes a plurality of the data lines 160 extending substantially in a second direction perpendicular to the first direction and intersecting the gate lines 120, each data line 160 having a predetermined bent pattern (see FIG. 1). In addition, the lower substrate 100 includes pixel electrodes 190 formed in substantially a chevron shape (see FIG. 3), and each extending from a corresponding gate line 120 to overlap an adjacent gate line 120 (see FIG. 1) Further, the lower substrate 100 also includes TFTs T connected to the gate lines 120, the data lines 160 and the pixel electrodes 190. Sequential adjacent TFTs T are alternately disposed on left and right sides of a corresponding data line 160, as shown in FIG. 1.

The gate lines 120 are disposed along the first direction, e.g., in an abscissa direction (a horizontal direction as viewed in FIGS. 1 to 4), on the first insulating substrate 110, each gate line 120 being formed in the predetermined bent pattern. Referring to FIG. 2, the gate line 120 includes a plurality of sets of gate line extension portions, each set of gate line extension including a first extension portion 120a extending substantially horizontally, e.g., in the first direction, a second extension portion 120b inclined substantially upward from the first extension portion 120a, a third extension portion 120c extending in substantially the first direction from the second extension portion 120b, e.g., parallel to and above the first extension portion 120a, and a fourth extension portion 120d extending substantially downward from the third extension portion 120c. In an exemplary embodiment, a set of gate line extension portions is disposed between each adjacent pair of gate electrodes 121. Further, the second extension portion 120b according to an exemplary embodiment extends upward from the first extension portion 120a at an angle of approximately 45 degrees (with respect to the first direction), for example, while the fourth extension portion 120d extends downward from the third extension portion 120c at an angle of approximately 45 degrees (with respect to the first direction). In addition, a ratio of lengths of the first, second, third and fourth extension portions 120a, 120b, 120c and 120d, respectively, may be, for example, 4:1:1:1. In this case, a ratio of the length of the first extension portion 120a and the lengths of the second, third and fourth extension portions 120b, 120c and 120d, respectively, is thereby 2:1.4. In addition, widths of portions of the gate line 120, measured in the second direction, are greater than widths of other portions, measured in the second direction, of the gate line 20 to form the gate electrodes 121, as shown in FIG. 2. Furthermore, each of the gate electrodes 121 is formed proximate to an associated first extension portion 120a, e.g., formed closer to the associated first extension portion 120a than a preceding fourth extension portion 120d associated with a preceding gate electrode 121 (as viewed in FIG. 2). Further, the gate electrodes 121 are formed at respective left and right sides of corresponding data lines 160 to form the TFTs T (see FIG. 1).

A gate insulating layer 130 is formed on the first insulating substrate 110 and the gate lines 120, as shown in FIGS. 5 to 7. In an exemplary embodiment, the gate insulating layer 130 is formed to have a single layer structure or, alternatively, a multiple layer structure, and includes an inorganic insulating layer such as $SiO_2$ or $SiN_x$, for example, but alternative exemplary embodiments are not limited thereto.

An active layer 140 (FIG. 5) made of a first semiconductor material such as amorphous silicon ("a-Si"), for example, is formed on the gate insulating layer 130 and, more particularly, on the gate electrode 121. An ohmic contact layer 150 made of a second semiconductor material such as n+ hydrogenated amorphous silicon doped with highly concentrated silicide or n-type impurity, for example, is formed on the active layer 140.

Referring now to FIG. 3, the data lines 160 extend in substantially the second direction e.g., an ordinate direction (a vertical direction as viewed in FIGS. 1 to 4), and intersect the gate lines 120 In a similar manner as for the gate lines 120, described in greater detail above, each data line 160 is formed to have the predetermined bent pattern. In particular, the data line 160 is formed by alternating portions which protrude to the left and the right of a corresponding data line 160. Specifically, the data line 160 includes a plurality of sets of data line extension portions, each set including a first extension portion 160a extending substantially in the ordinate direction from the respective data line 160, as shown in FIG. 3. More specifically, the data line 160 according to an exemplary embodiment of the present invention is formed by disposing portions as shown in FIG. 3: disposing an upper first extension portion 160a and a second extension portion 160b protruding substantially to the left from the upper first extension portion 160a; disposing a lower first extension portion 160a' a fourth extension portion 160d protruding substantially to the left from the lower first extension portion 160a'; and disposing a third extension portion 160c between the second expansion portion 160b and the fourth expansion portion 160d. In an exemplary embodiment, the second extension portion 160b extends substantially downward, e.g., to the left, at a predetermined angle, such as an angle of approximately 45 degrees from the first extension portion 160a, while the third extension portion 160c extends substantially vertically, e.g., in the ordinate direction (the second direction) from the second extension direction 160b, while the fourth extension portion 160d extends substantially downward to the right from the third extension portion 160c at a predetermined angle, e.g., an angle of approximately 45 degrees, to connect the third extension portion 160c and the lower first extension portion 160a', as shown in FIG. 3. In addition, a fifth extension portion 160e extends downward and to the right at a predetermined angle, e.g., an angle of approximately 45 degrees, from the lower first extension portion 160a', and a sixth extension portion 160f extends substantially vertically, e.g., in the ordinate or second direction, from the fifth extension direction 160e to a seventh extension portion 160g which extends substantially downward and to the left at a predetermined angle, e.g., an angle of approximately 45 degrees, from the sixth extension portion 160f, as shown in FIG. 3.

In an exemplary embodiment, a ratio of a length of the upper first extension portion 160a, a length of the second extension portion 160b and a length of the fourth extension portion 160d, is, for example, 1:1:1. Further, a ratio of lengths of the lower first extension portion 160a' and the third and/or sixth extension portions 160c and/or 160f, respectively, are, for example, 4:3. Furthermore, a ratio of lengths of the third extension portion 160c and the length of the second and/or fourth extension portions 160b and/or 160d, respectively, is 2:1, while a ratio of a length the sixth extension portion 160f and a length of the fifth and/or seventh extension portions 160e and/or 160g, respectively, is 2:1.

Referring to FIGS. 1, 3 and 7, source electrodes 161 are formed by extending portions of the third and sixth extension portions 160c and 160f, respectively, to the right and left, respectively. A drain electrode 162 is formed spaced apart from the source electrodes 161.

In an exemplary embodiment, the gate lines 120 are formed to intersect the third and sixth extension portions 160c and 160f, respectively, as shown in FIGS. 1 to 3. A dummy electrode 163 (FIG. 3) is formed at a region symmetric to the drain electrode 162 with respect to the data line 160, and has substantially a same shape and size as the drain electrode 162. The dummy electrode 163 is formed to be substantially symmetric to the drain electrode 162, and aperture ratios and transmittances to the left and right of the pixel electrode 190 are thereby substantially equal, thereby effectively improving visibility in an LCD according to an exemplary embodiment of the present invention.

The gate, source and drain electrodes 121, 161 and 162, respectively, form the TFT T, and a channel of the TFT T is formed between the source electrode 161 and the drain electrode 162. The TFT T allows a pixel signal supplied to the data line 160 to be charged into the pixel electrode 190 in response to a signal supplied to the gate line 120. The TFT T further includes the gate insulating layer 130, the active layer 140 and the ohmic contact layer 150, sequentially formed between the gate electrode 121 and each of the source and drain electrodes 161 and 162, respectively. In an exemplary embodiment, the ohmic contact layer 150 may have a channel portion formed on the active layer 140, as shown in FIG. 5.

Referring to FIGS. 1, 3 and 6, storage electrode lines 170 are formed on the same layer as the data lines 160. In an exemplary embodiment, the storage electrode line 170 is formed at a central longitudinal portion between two adjacent data lines 160, to substantially pass through the central longitudinal portion between the two adjacent data lines 160, as shown in FIG. 3. A storage electrode 171 is formed by protruding a portion of the storage electrode line 170 to have a width greater than widths of other portions of the storage electrode line 170. The storage electrode 171 is formed in a region overlapping at least a portion of the pixel electrode 190 to have, for example, substantially a same width as the third extension portion 120c of the gate line 120 (see FIG. 2). The storage electrode 171 overlaps the pixel electrode 190 to form a storage capacitor.

In an exemplary embodiment, the gate line 120, the data line 160 and the storage electrode line 170 are formed of at least any one of aluminum (Al), copper (Cu), neodymium CNd), silver (Ag), chromium (Cr), titanium (Ti), tantalum (Ta), molybdenum (Mo) and/or an alloy thereof, but alternative exemplary embodiments of the present invention are not limited thereto. Further, the gate line 120, the data line 160 and/or the storage electrode line 170 may be formed to have a single layer structure or, alternatively, a multiple layer structure, e.g., a structure including a plurality of metal layers. In an exemplary embodiment including the multiple layer structure, for example, the plurality of metal layers includes two layers having different physical properties, e.g., a layer formed of a material having a low specific resistance and a layer formed of a material having an excellent contact property. The layer formed of the material having the low specific resistance may be, for example, an Al-, Ag- or Cu-based metal to reduce a signal delay or voltage drop. The layer formed of the material having the excellent contact property may be formed of, for example, a material having an excellent contact property with indium tin oxide ("ITO") and indium zinc oxide ("IZO"), e.g., Cr, Mo, Mo alloy, Ta or Ti, for example, but not being limited thereto.

Referring to FIGS. 5 to 7, a protective layer 180 is formed on the data lines 160 and storage electrode lines 170. In an exemplary embodiment, the protective layer 180 has an excellent planarization property and is formed of an organic material with photosensitivity, a low permittivity insulating material formed using plasma enhanced chemical vapor deposition ("PECVD"), for example, or an inorganic material such as silicon nitride, for example. The protective layer 180 according to an exemplary embodiment includes a first insulating layer 181 formed of silicon nitride or silicon oxide and having a small thickness and a second insulating layer 182 formed of an organic material and having a large thickness (relative to the first insulating layer 181). In an exemplary embodiment, color filters are formed in place of the second insulating layer 182, thereby producing an LCD panel manufactured to have a color filter on array ("COA") structure with the color filters formed on the lower substrate 100.

A first contact hole 185 for exposing a predetermined region of the drain electrode 162 and a second contact hole 186 for exposing an upper portion of the storage electrode 171 are formed in the protective layer 180, as shown in FIG. At this time, the first contact hole 185 is formed by removing the first and second insulating layers 181 and 182, and the second contact hole 186 is formed by remaining the first insulating layer 181 and removing the second insulating layer 182.

The pixel electrodes 190, made of ITO or IZO, are formed, for example, in a substantially chevron shape on the protective layer 180 and between adjacent data lines 160, as shown in FIGS. 1, 3 and 4. As best shown in FIG. 4, the pixel electrode 190 extends substantially upward with a predetermined width and angle from a region proximate to the first extension portion 120a(FIG. 2) of one of the gate lines 120 and then extends substantially downward at approximately the same angle, so that the pixel electrode 190 is formed up to approximately the first extension portion 120a of an adjacent gate line 120. In an exemplary embodiment, a width of the pixel electrode 190 is equal to approximately ½ of a width of a distance between adjacent gate lines 120, and extends upward at an angle of approximately 45 degrees from a central longitudinal portion substantially dividing, e.g., splitting in half, a first extension portion 120a of a gate line 120, and then extends downward at an angle of approximately 45 degrees, e.g., the same angle, so that the pixel electrode 190 is formed to extend to a longitudinal central portion dividing a first extension portions 120a of an adjacent gate line 120. Thus, the pixel electrode 190 extends upward a position between a third extension portion 120c of a first lines 120 adjacent to a second gate line 120 and a third extension portion 120c of a third gate line 120 adjacent to the second gate line 120, and then extends downward therefrom. Hence, the pixel electrode 190 overlaps two adjacent gate lines 120. Accordingly, an increase in a kickback voltage is effectively prevented in an LCD according to an exemplary embodiment of the present invention.

In addition, a peripheral side of the pixel electrode 190 at least partially overlaps the gate electrode 121 and the source electrode 161, while and an opposite lateral side of the pixel electrode 190 at least partially overlaps with a protruding portion of the data line 160, as shown in FIG. 5. Accordingly, in a vertical inversion driving mode of an LCD according to an exemplary embodiment, parasitic capacitance between the pixel electrode 190 and the two data lines 160 adjacent thereto is maintained at a substantially constant level, to thereby prevent vertical crosstalk and/or row-to-row brightness variation between even- and odd-numbered pixel rows.

Referring again to FIG. 4, a cutout portion 195 is formed in the pixel electrode 190. More specifically, the cutout portion 195 is formed by removing a portion of the pixel electrode 190 in a region in which the pixel electrode 190 is symmetrical from left to right, as viewed in FIG. 4. In addition, the pixel electrode 190 at least partially overlaps the storage electrode 171, and the storage electrode line 170 passes through the cutout portions 195 of the pixel electrodes 190.

In an exemplary embodiment, the pixel electrode 190 is connected to the drain electrode 162 through the first contact hole 185. Further, the pixel electrode 190 at least partially overlaps the storage electrode 171 through the second contact hole 186, thereby forming a storage capacitor wherein the first insulating layer 181 is interposed between the pixel electrode 190 and the storage electrode 171. In addition, the storage capacitance of the storage capacitor is sufficient, since the first insulating layer 181 is formed to be thinner than the second insulating layer 182, as described in greater detail above. In an exemplary embodiment, the storage capacitance is adjusted by controlling an overlapping area of the storage electrode 171 and the pixel electrode 190.

Referring now to FIGS. 5 to 7, the upper substrate 200 includes a black matrix 220 formed in a non-pixel regions formed on a second insulating substrate 210. Color filters 230 of red, green and blue color, for example, are formed in regions corresponding to the pixel regions, e.g., where the black matrix 220 is not formed, and a common electrode 240 is formed of a transparent conductive material on the second insulating substrate 210 of the upper substrate 200.

More specifically, the black matrix 220 is formed in a predetermined region of the second insulating substrate 210 corresponding to a region except the pixel regions, to effectively prevent light from leaking to and/or from the predetermined region, e.g., a region between pixel regions, and thereby prevent light from interfering with adjacent pixel regions. Thus, the black matrix 220 is formed in a region except the pixel regions, e.g., a region corresponding to the gate lines 120 and the TFTs T formed on the lower substrate 100. Further, the black matrix 220 is formed in the ordinate direction along the first extension portions 160a to pass between protruding portions of the data line 160, which are formed to be bent, as described in further detail above with reference to FIG. 3. In an exemplary embodiment, the black matrix 220 is formed of a photosensitive organic material containing a black pigment, for example, but alternative exemplary embodiments of the present invention are not limited thereto. A material such as carbon black or titanium oxide, for example, may be used as the black pigment. In addition, the black matrix 220 according to an alternative exemplary embodiment may include a metallic material such as chromium (Cr) or chromium oxide ("$CrO_x$"), for example, but is not limited thereto.

In an exemplary embodiment, the color filters 230 are formed by alternating red, green and blue filters in the alternating adjacent pixel regions with the black matrix 220 serving as a boundary therebetween. The color filters 230 allow light emitted from a light source (not shown) to pass through the liquid crystal layer 300, thereby allowing color display with the LCD. In an exemplary embodiment, the color filter 230 is formed of a photosensitive organic material, but alternative exemplary embodiments are not limited thereto.

The common electrode 240 is formed on surfaces of the black matrix 220 and color filters 230 and is formed of a transparent conductive material such as ITO or IZO, for example. The common electrode 240, together with the pixel electrodes 190 of the lower substrate 100, applies a voltage to the liquid crystal layer 300 to generate an electric field therein.

Cutout portions 241 are formed in the common electrode 240, as shown in FIG. 6. The cutout portions 241 of the common electrode are formed along longitudinal central portions of the pixel electrodes 190 formed in the chevron shape. Hence, liquid crystal molecules in the liquid crystal layer 300 are inclined based on the cutout portions 241 of the common electrode.

In addition, a vertical alignment layer (not shown) and a polarizer (not shown) are formed on inner and outer surfaces, respectively, of each of the lower substrate 100 and the upper substrate 200. Transmission axes of the polarizers (not shown) are substantially perpendicular to each other, and a transmission axis of one polarizer is in substantially parallel to the gate lines 120. Retardation films (not shown), which compensate for a delay value of the liquid crystal layer 300, may be formed between the lower substrate 100 and the polarizer (not shown) and between the upper substrate 200 and the polarizer (not shown). The retardation film (not shown) has birefringence and functions to inversely compensate for the birefringence of the liquid crystal layer 300. In an exemplary embodiment, a uniaxial or a biaxial optical film may be used as the retardation film, but alternative exemplary embodiments are not limited thereto. For example, in an exemplary embodiment of the present invention, a negative uniaxial optical film is used as the retardation film (not shown).

Figure 8:
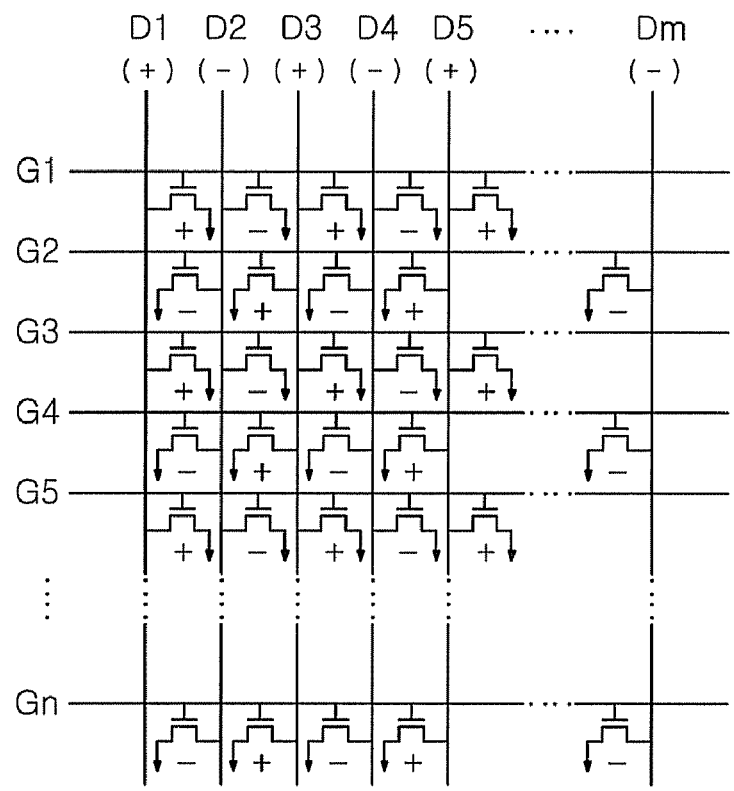
FIG. 8 is a schematic view illustrating a connection state of thin film transistors in an LCD panel according to an exemplary embodiment of the present invention.

FIG. 8 is a schematic view illustrating a connection state of thin film transistors in an LCD panel according to an exemplary embodiment of the present invention. In the LCD panel according to the exemplary embodiment of the present invention configured as shown in FIG. 8, odd-numbered gate lines G1, G3, ..., Gn-1 of the plurality of gate lines 120 are connected to data lines D1 to Dm-1 of the plurality of data lines 160 disposed at left peripheral sides thereof to form TFTs T (see FIG. 5), and even gate lines G2, G4, ..., Gn are connected to data lines D2 to Dm disposed at right peripheral sides thereof to form TFTs T. Thus, a plurality of the data lines D1 to Dm extend to the left and right peripheral sides or, alternatively, to the right and left peripheral sides, depending on whether the data lines D1 to Dm are connected to the odd-numbered gate lines G1, G3, ..., Gn-1 or to the even-numbered gate lines G2, G4, ..., Gn, thereby forming the TFTs T. In FIG. 8, data signals with positive polarities ("+") and negative polarities ("−") polarities are sequentially and alternately applied to data lines D1 to Dm of the plurality of data lines D1 to Dm, and data signals with (+), (−), (+), (−), ... polarities are thereby sequentially applied to the pixel regions between the odd-numbered gate lines G1, G3, ..., Gn-1 and the data lines D1 to Dm, while data signals with (−), (+), (−), (+), ... polarities are thereby sequentially applied to pixel regions between the even-numbered gate lines G2, G4, ..., Gn and the data lines D1 to Dm. Thus, although data signals are applied in a vertical inversion mode, the LCD panel according to an exemplary embodiment of the present invention is effectively driven in a dot inversion mode.

Figure 9:
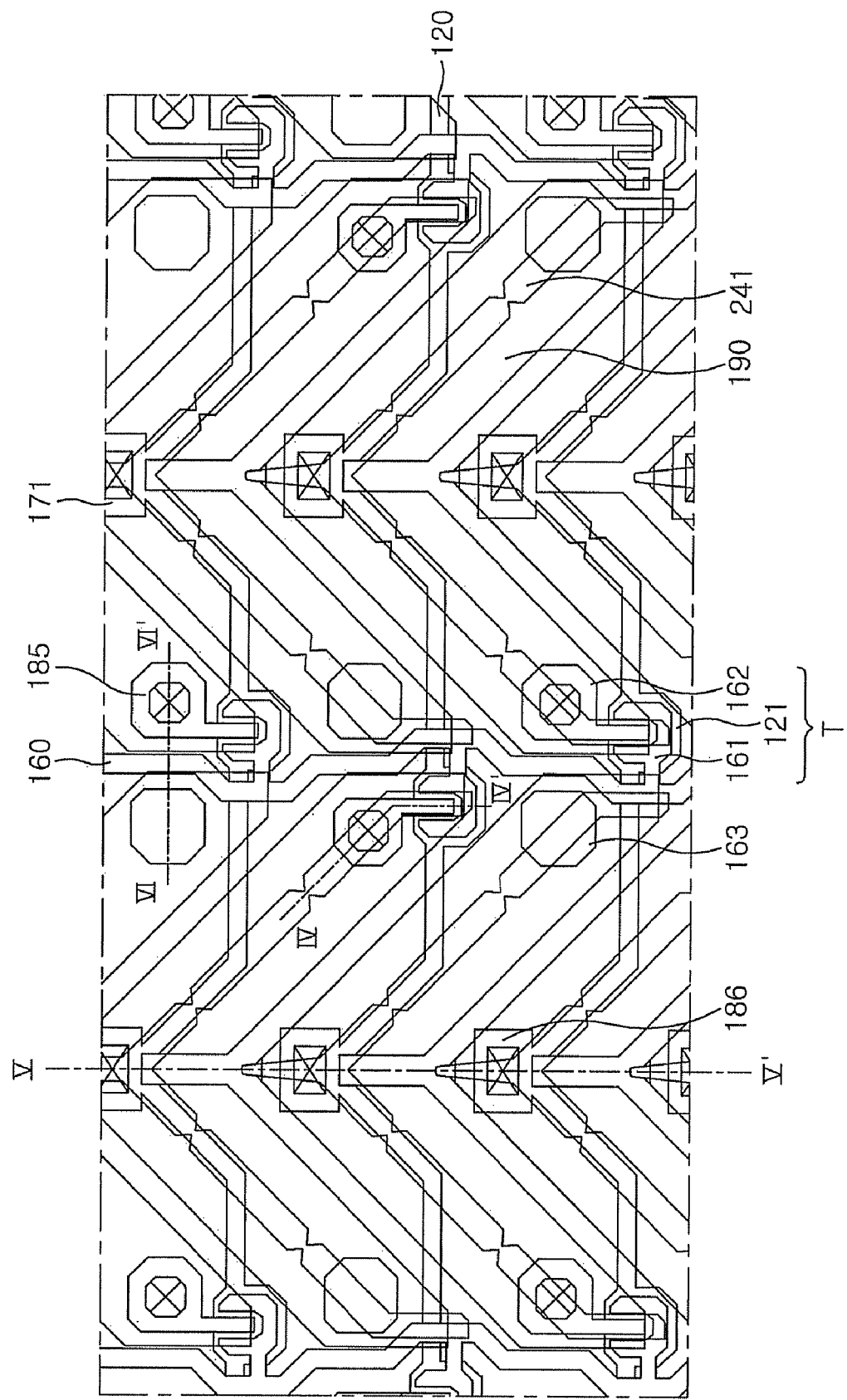
FIG. 9 is a plan view of an LCD panel according to another exemplary embodiment of the present invention.
Figure 10:
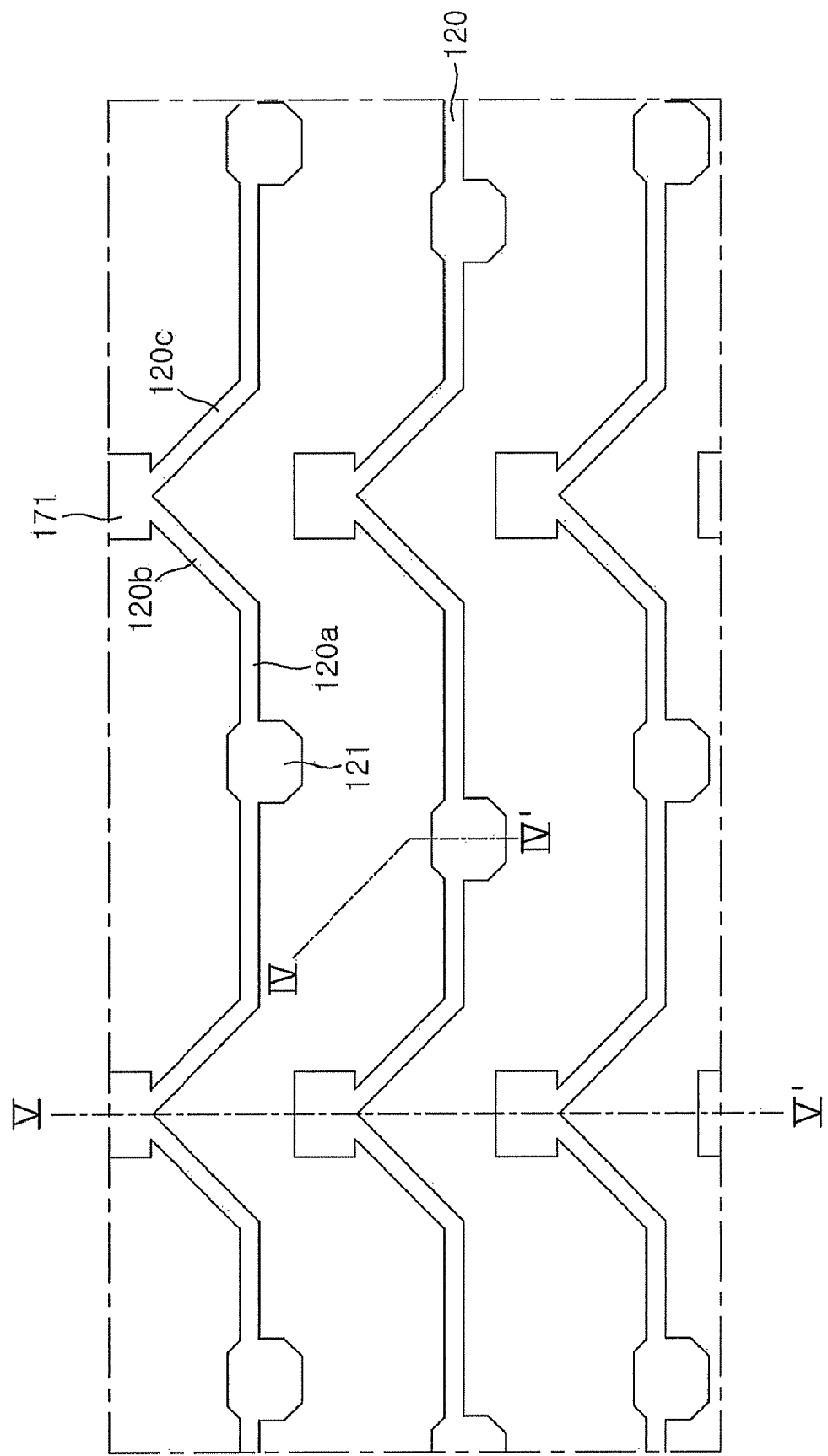
FIG. 10 is a plan view showing gate lines of the LCD according to the exemplary embodiment shown in FIG. 9.
Figure 11:
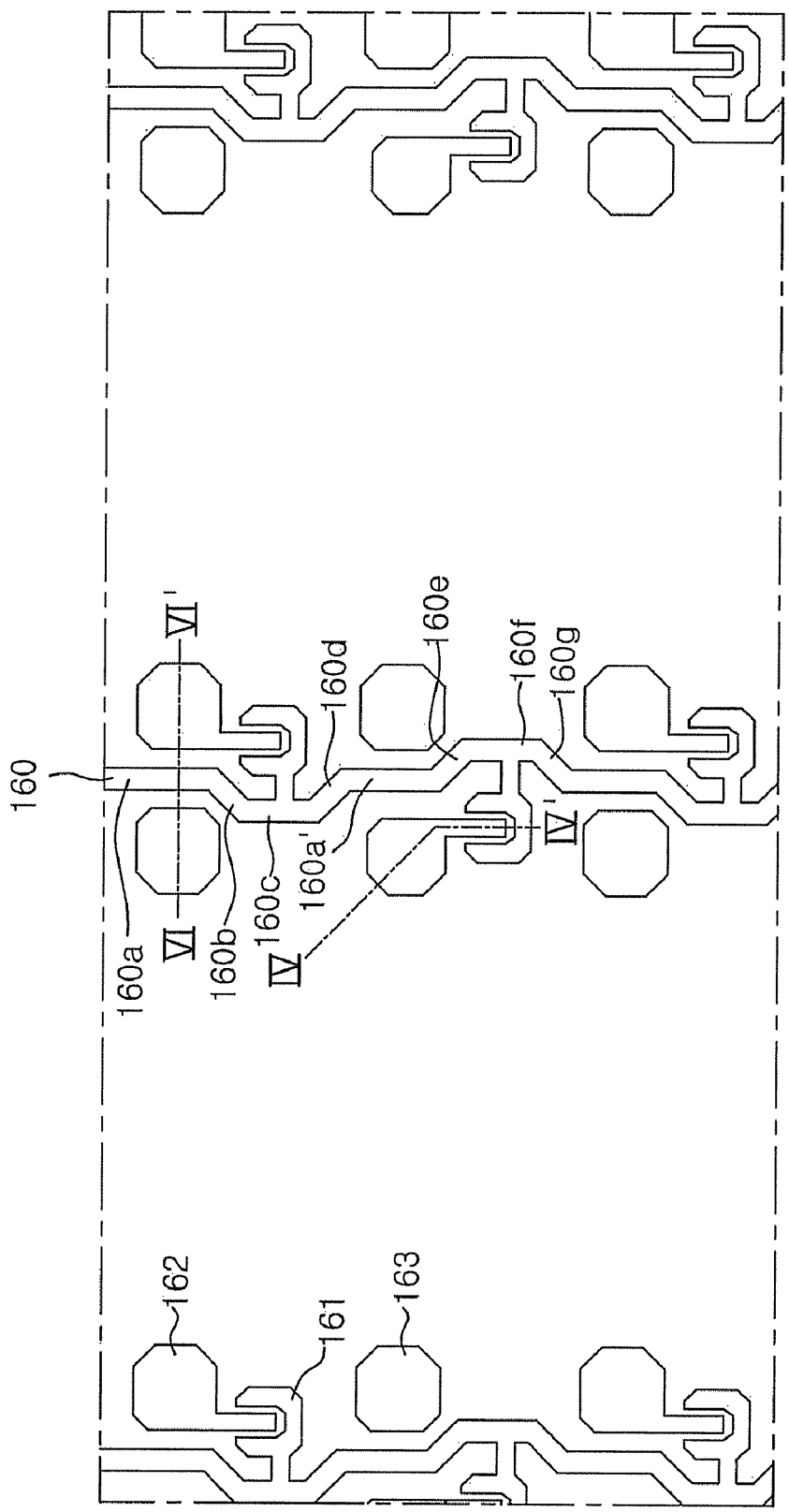
FIG. 11 is a plan view showing data lines and storage electrode lines of the LCD according to the exemplary embodiment shown in FIG. 9.
Figure 12:
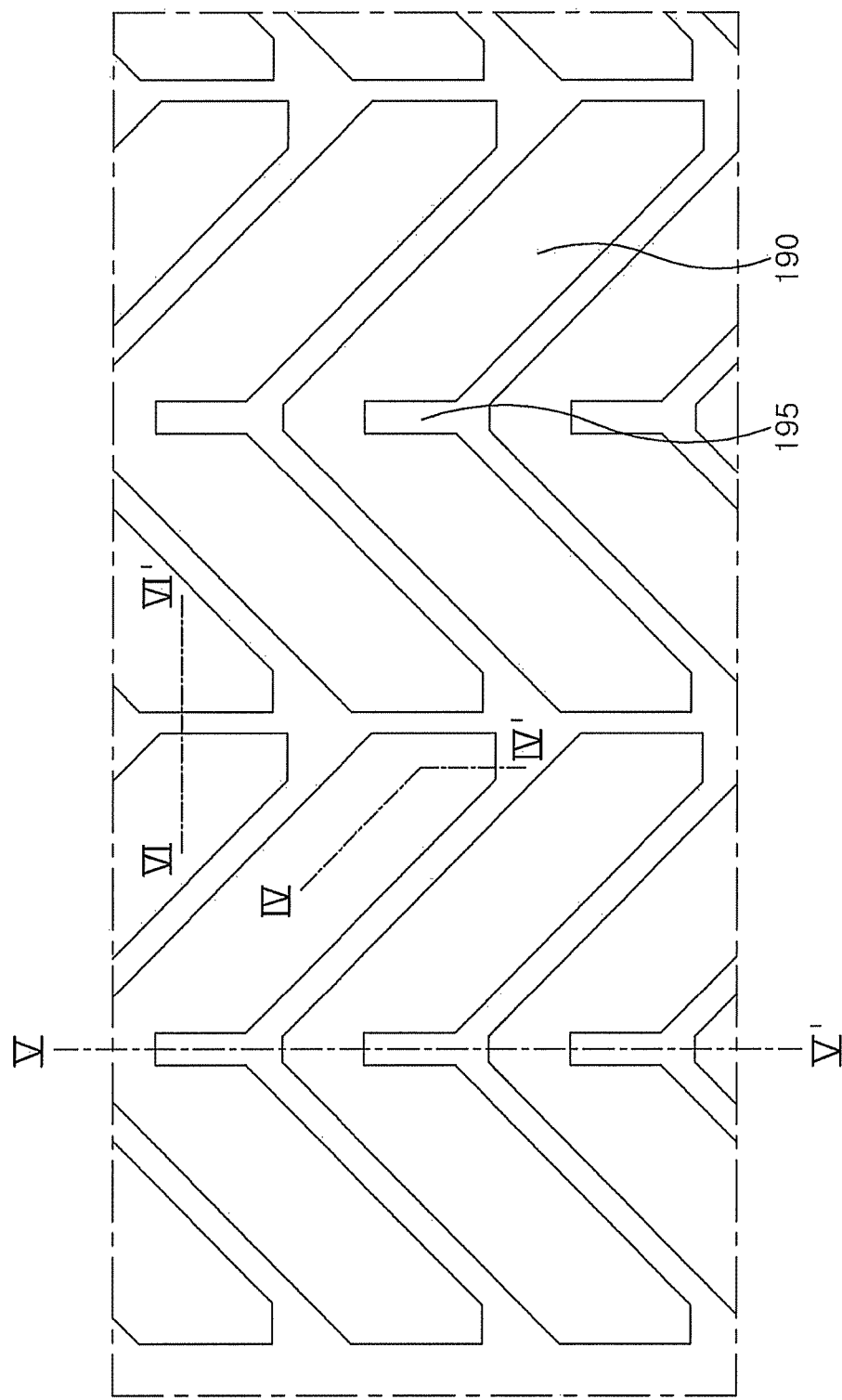
FIG. 12 is a plan view showing pixel electrodes of the LCD according to the exemplary embodiment shown in FIG. 9.
Figure 13:
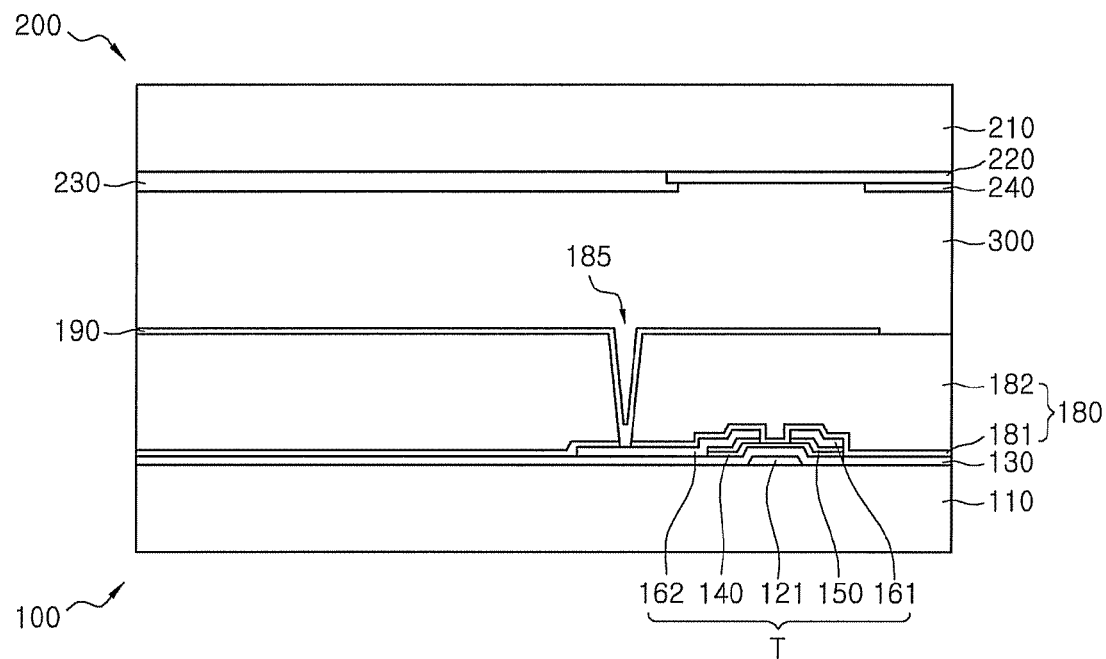
FIG. 13 is a partial cross-sectional view taken along line IV-IV' in FIG. 9.
Figure 14:
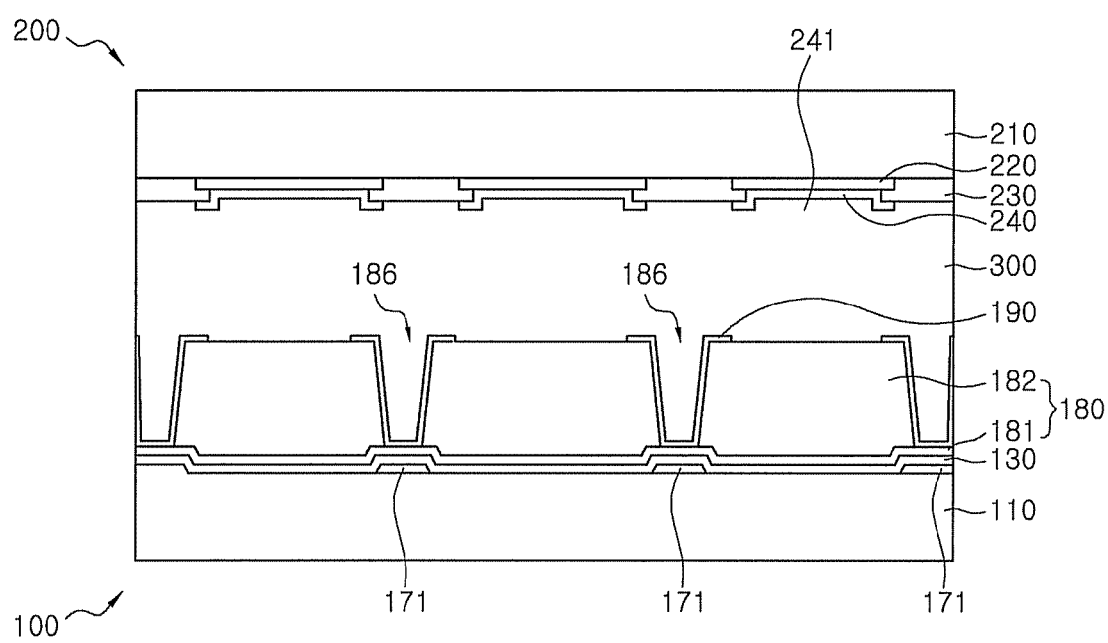
FIG. 14 is a partial cross-sectional view taken along line V-V' in FIG. 9.
Figure 15:
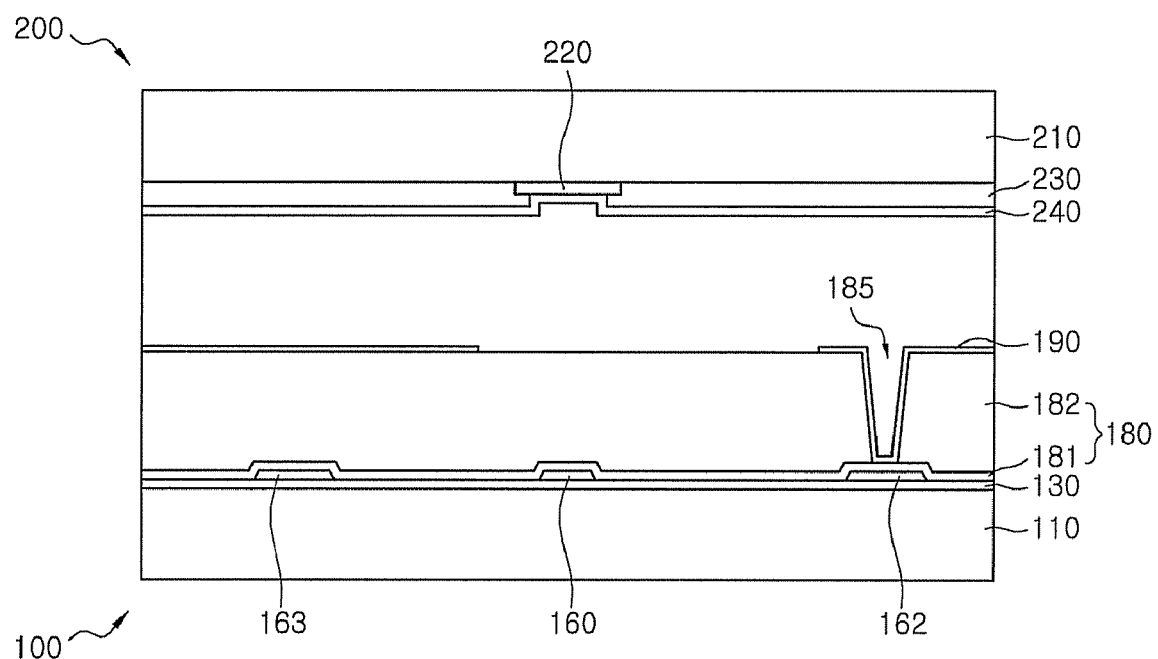
FIG. 15 is a partial cross-sectional view taken along line VI-VI' in FIG. 9.

FIG. 9 is a plan view of an LCD panel according to an alternative exemplary embodiment of the present invention. FIG. 10 is a plan view showing gate lines of the LCD according to the exemplary embodiment shown in FIG. 9, FIG. 11 is a plan view showing data lines of the LCD according to the exemplary embodiment shown in FIG. 9, and FIG. 12 is a plan view showing pixel electrodes of the LCD according to the exemplary embodiment shown in FIG. 9. FIG. 13 is a partial cross-sectional view taken along line IV-IV' in FIG. 9, FIG. 14 is a partial cross-sectional view taken along line V-V' in FIG. 9, and FIG. 15 is a partial cross-sectional view taken along line VI-VI' in FIG. 9. The same reference characters in FIGS. 9 to 15 refer to the same or like components in FIGS. 1 to 8, and any repetitive detailed description thereof may hereinafter be omitted.

Referring to FIGS. 9 to 15, the LCD panel according to an exemplary embodiment of the present invention includes a lower substrate 100 with gate lines 120, data lines 160 and TFTs T formed thereon, an upper substrate 200 including a common electrode 240 formed thereon, and a liquid crystal layer 300 interposed between the lower substrate 100 and the upper substrate 200.

The lower substrate 100 includes a plurality of the gate lines 120 extending substantially in a first direction on a first insulating substrate 110, each gate line 120 having a predetermined bent pattern (FIG. 10), and storage electrodes 171 formed to protrude from the gate lines 120. The lower substrate 100 further includes a plurality of the data lines 160 extend substantially in a second direction, the second direction being substantially perpendicular to the first direction, and intersecting the gate lines 120, each data line 160 having a predetermined bent pattern (FIG. 11). In addition, the lower substrate includes pixel electrodes 190 formed in a substantially chevron shape (FIG. 12), each pixel electrode 190 extending from one of the gate lines 120 to overlap at least a portion of an adjacent the gate line 120, and TFTs T connected to each of the gate lines 120, the data lines 160 and the pixel electrodes 190 and arranged to zigzag left to right, e.g., being disposed on alternating sides of the data lines 160, as best shown in FIG. 9.

Referring to FIGS. 9 and 10, the gate line 120 is formed in the first direction, e.g., an abscissa direction (a horizontal direction in FIGS. 9 to 12), on the first insulating substrate 110 to have the predetermined bent pattern shown in FIG. 10. More specifically and with reference to FIG. 10, the gate line 120 includes a plurality of sets of extension portions, each set including a first extension portion 120a extending substantially horizontally from a gate electrode 121, a second extension portion 120b extending from the first extension portion 120a and inclined substantially upward (as viewed in FIG. 10) from the first extension portion 120a toward the storage electrode 171, and a third extension portion 120c extending substantially downward from the storage electrode 171 toward the gate line 120. In an exemplary embodiment, the sets of extension portions are repeatedly formed to extend along the first direction, as shown in FIG. 10. Further, the second extension portion 120b according to an exemplary embodiment extends upward from the first extension portion 120a at an angle of approximately 45 degrees, for example, and the third extension portion 120c extends downward from the storage electrode 171 at an angle of approximately 45 degrees, for example. In addition, a ratio of lengths of the first, second and third extension portions 120a, 120b and 120c, respectively, may be, for example, 2.5:1:1. Hence, a ratio of the length of the first extension portion 120a and the length of the second and third extension portions 120b and 120c, respectively, is approximately 2:1.12.

Portions of the gate line 120 protrude to have a broader width than other portions thereof, thereby forming the gate electrodes 121. As shown in FIG. 10, the gate electrodes 121 are formed proximate to the first extension portion 120a, e.g., formed closer to the first extension portion 120a than the second extension portion 120b and/or the third extension portion 120c. Further, the gate electrodes 121 are formed to zigzag left to right with respect to the respective data lines 160, e.g., are disposed on alternating left and right sides of a corresponding data line 160, as best illustrated in FIG. 9.

The storage electrode 171 (FIGS. 9 and 10) is formed by forming a protrusion which extends from the gate line 120 in substantially the second direction. In addition, the storage electrode 171 according to an exemplary embodiment is formed to have a substantially rectilinear shape having a predetermined width and height and being disposed at an intersection region of the second extension portion 120b and the third extension portion 120c to overlap at least a portion of the pixel electrode 190. Since the storage electrode 171 is formed to protrude from the gate line 120, it is unnecessary to form an additional storage electrode line, thereby increasing a production efficiency of an LCD according to an exemplary embodiment of the present invention. Furthermore, since a storage electrode line is not formed, an aperture ratio of the LCD is thereby improved, and a manufacturing pattern is simplified. In addition, when storage electrode lines are formed on the same layer as the gate lines 120, a short circuit may occur between the storage electrodes line and the gate lines 120, and an exemplary embodiment in which the storage electrode line is not required effectively prevents the short circuit, thereby increasing a reliability of the LCD according to an exemplary embodiment of the present invention.

Since the storage electrode 171 is formed to protrude from the gate line 120, a capacitance of the gate line 120 may increase. However, there is no overlapping capacitance of the gate lines 120 and storage electrode lines, and any increase in capacitance of the gate line 120 is thereby effectively offset, e.g., any effects thereof are minimized in the LCD according to an exemplary embodiment of the present invention. Further, any increase in capacitance is relatively small in comparison with capacitances of an LCD having storage electrode lines.

Referring to FIGS. 13 to 15, a gate insulating layer 130 is formed on the first insulating substrate 110 including the gate lines 120. An active layer 140 is formed on the gate insulating layer 130 on the gate electrode 121, and an ohmic contact layer 150 is formed on the active layer 140.

The data lines 160 extend in substantially the second direction, e.g., an ordinate direction (a vertical direction in FIGS. 9 to 12), and intersect the gate lines 120 Further, the data lines 160 each have the predetermined bent pattern. More specifically, the data line 160 is formed by alternating portions which protrude to the left and the right of a corresponding data line 160. Specifically, the data line 160 includes a plurality of sets of data line extension portions, each set including a first extension portion 160a extending substantially in the ordinate direction from the respective data line 160, as shown in FIG. 11. In particular, the data line 160 according to an exemplary embodiment of the present invention is formed by disposing portions as shown in FIG. 11; disposing an upper first extension portion 160a and a second extension portion 160b protruding substantially to the left from the upper first extension portion 160a; disposing a lower first extension portion 160a' a fourth extension portion 160d protruding substantially to the left from the lower first extension portion 160a'; and disposing a third extension portion 160c between the second expansion portion 160b and the fourth expansion portion 160d. In an exemplary embodiment, the second extension portion 160b extends substantially downward, e.g., to the left, at a predetermined angle, such as an angle of approximately 45 degrees from the first extension portion 160a, while the third extension portion 160c extends substantially vertically, e.g., in the ordinate direction (the second direction) from the second extension direction 160b, while the fourth extension portion 160d extends substantially downward to the right from the third extension portion 160c at a predetermined angle, e.g., an angle of approximately 45 degrees, to connect the third extension portion 160c and the lower first extension portion 160a', as shown in FIG. 11. In addition, a fifth extension portion 160e extends downward and to the right at a predetermined angle, e.g., an angle of approximately 45 degrees, from the lower first extension portion 160a', and a sixth extension portion 160f extends substantially vertically, e.g., in the ordinate or second direction, from the fifth extension direction 160e to a seventh extension portion 160g which extends substantially downward and to the left at a predetermined angle, e.g., an angle of approximately 45 degrees, from the sixth extension portion 160f, as shown in FIG. 11.

The gate, source and drain electrodes 121, 161 and 162, respectively, form the TFT T, and a channel of the TFT T is formed between the source electrode 161 and the drain electrode 162. The TFT T includes the gate insulating layer 130, the active layer 140 and the ohmic contact layer 150, sequentially formed between the gate electrode 121 and each of the source electrode 161 and the drain electrode 162, as shown in FIG. 13.

As shown in FIGS. 13 to 15, a protective layer 180 is formed on the data lines 160. The protective layer 180 includes a first insulating layer 181 formed of silicon nitride or silicon oxide, for example, and a second insulating layer 182 formed of an organic material. In an exemplary embodiment, a thickness of the second insulating layer 182 is large relative to a thickness of the first insulating layer 181. In an alternative exemplary embodiment, color filters may be formed in place of the second insulating layer 182 to manufacture an LCD panel according to an exemplary embodiment of the present invention having a COA structure.

A first contact hole 185 for exposing a predetermined region of the drain electrode 162 and a second contact hole 186 for exposing an upper portion of the storage electrode 171 are formed in the protective layer 180, as shown in FIGS. 13 to 15. In an exemplary embodiment, the first contact hole 185 is formed by removing the first insulating layers 181 and the second insulating layer 182, and the second contact hole 186 is formed by removing the second insulating layer 182. In an alternative exemplary embodiment of the present invention, however, the second contact hole 186 may be formed by removing the first insulating layer 181, as well as the second insulating layer 182.

The pixel electrodes 190 are made of a material such as ITO or IZO, and are formed, for example, in a chevron shape (best shown in FIG. 12) on the protective layer 180 and between adjacent data lines 160 (FIG. 9). Further, the pixel electrode 190 extends substantially upward at a predetermined width and angle from a region proximate to the first extension portion 120a of a gate line 120, and then extends substantially downward at approximately the same angle, so that the pixel electrode 190 extends to the a region of a first extension portion 120a of an adjacent gate line 120. In addition, the pixel electrode 190 has a first side which partially overlaps the gate electrode 121 and the source electrode 161 (FIG. 13), while a second side partially overlaps a protruding portion of the data line 160. The pixel electrode 190 is formed in the chevron shape to overlap at least a portion of the adjacent gate line 120. A cutout portion 195 is formed in the pixel electrode 190, as shown in FIG. 12. In an exemplary embodiment, the cutout portion 195 is formed by removing a portion of the pixel electrode 190 in a region in which the pixel electrode 190 is substantially symmetrical (left to right in FIG. 12). The pixel electrode 190 is formed to overlap at least a portion of the storage electrode 171, as shown in FIG. 14.

The pixel electrode 190 is connected to the drain electrode 162 through the first contact hole 185. Further, the pixel electrode 190 overlaps at least a portion of the storage electrode 171 through the second contact hole 186 to form a storage capacitor, wherein the gate insulating layer 130 and the first insulating layer 181 are interposed between the pixel electrode 190 and the storage electrode 171. Since the first insulating layer 181 is formed to be thin relative to the second storage electrode 182, a storage capacitance of the storage capacitor is ensured. In an exemplary embodiment, the storage capacitance is adjusted by controlling an overlapping area of the storage electrode 171 and pixel electrode 190. In an alternative exemplary embodiment, the storage electrode 171 and the pixel electrode 190 may also form a storage capacitor with only the gate insulating layer 130 interposed therebetween.

The upper substrate 200 according to an exemplary embodiment of the present invention includes a black matrix 220 formed in a non-display region on a second insulating substrate 210. In addition, color filters 230 including red, green and blue colors, for example, are formed in display regions corresponding to pixel regions, e.g., regions in which the black matrix 220 is not formed, and a common electrode 240 formed of a transparent conductive material, for example is disposed on the upper substrate 200, as shown in F FIGS. 13 to 15.

Thus, according to exemplary embodiments of the present invention as described herein, an LCD having pixels arranged in an abscissa direction includes a pixel electrode formed in a chevron shape and being disposed to overlap at least a portion of an adjacent gate line, thereby improving an aperture ratio even in a middle/small-sized viewing area. In addition, gate lines are formed along cutout portions of a common electrode in an upper substrate, thereby improving an aperture ratio of the LCD according to an exemplary embodiment of the present invention.

Further, a pixel electrode is formed to overlap at least a portion of an adjacent gate line, thereby effectively preventing an increase in a kickback voltage in the LCD according to an exemplary embodiment.

Furthermore, the pixel electrode has a first side which overlaps at least a portion of a source electrode and a second side which overlaps at least a portion of a data line, and a parasitic capacitance between the pixel electrode and adjacent data lines is constantly maintained in a vertical inversion driving mode, thereby effectively preventing vertical crosstalk and row-to-row brightness variation between even- and odd-numbered pixel rows, thereby improving visibility in the LCD according to an exemplary embodiment of the present invention.

In addition, a storage electrode is formed as a protrusion from a gate line, eliminating a requirement for a storage electrode line and thereby resulting in an improved aperture ratio of the LCD according to an exemplary embodiment of the present invention.

The present invention should not be construed as being limited to the exemplary embodiments set forth herein. Rather, these exemplary embodiments are provided so that this disclosure will be thorough and complete and will fully convey the concept of the present invention to those skilled in the art.

While the present invention has been particularly shown and described with reference to exemplary embodiments thereof, the present invention is not limited thereto, and it will be understood by those of ordinary skill in the art that various modifications and changes in form and details may be made therein without departing from the spirit or scope of the present invention as defined by the following claims.

What is claimed is:

1. A thin film transistor substrate, comprising:
   gate lines extending along a first direction;
   data lines extending along a second direction intersecting the first direction, each data line including a source electrode and a drain electrode spaced apart from the source electrode; and
   a pixel electrode bent to extend at an angle from a first gate line to a second gate line adjacent to the first gate line, a portion of the pixel electrode formed to overlap a portion of the second gate line, wherein the portion of the second gate line includes a bent pattern.

2. The thin film transistor substrate as claimed in claim 1, wherein the bent pattern includes a bent portion bent at approximately the same angle at which the pixel electrode extends from the first gate line toward the second gate line.

3. The thin film transistor substrate as claimed in claim 1, wherein a first side of the pixel electrode at least partially overlaps a drain electrode of a first data line and a second side of the pixel electrode, opposite the first side, overlaps at least a portion of a second data line adjacent to the first data line.

4. The thin film transistor substrate as claimed in claim 3, wherein at least one of the first data line and the second data line includes a protrusion which overlaps at least a portion of the pixel electrode, the protrusion comprising protruding patterns disposed along the second direction on alternating opposite sides of the at least one of the first data line and the second data line.

5. The thin film transistor substrate as claimed in claim 1, further comprising:
   a gate insulating layer formed between a data line and at least one of the first gate line and the second gate lines; and
   a protective layer formed between the data line and the pixel electrode.

6. The thin film transistor substrate as claimed in claim 5, further comprising:
   a storage electrode line formed parallel to the data line in a same layer as the data line; and
   a storage electrode connected to the storage electrode line and which overlaps at least a portion of the pixel electrode.

7. The thin film transistor substrate as claimed in claim 5, further comprising a storage electrode extending from at least one of the first the gate line and the second gate line and which overlaps at least a portion of the pixel electrode.

8. The thin film transistor substrate as claimed in claim 7, wherein a portion of the protective layer disposed above the storage electrode is removed.

9. The thin film transistor substrate as claimed in claim 5, wherein the protective layer comprises at least one of an organic layer and a color filter.

10. The thin film transistor as claimed in claim 1, wherein a width of a gap between adjacent data lines is greater than a width of a gap between the first gate line and the second gate line.

11. A liquid crystal display, comprising:
   a first substrate comprising:
      gate lines extending along a first direction;
      data lines extending along a second direction intersecting the first direction, each data line including a source electrode and a drain electrode spaced apart from the source electrode; and
      a pixel electrode bent to extend at an angle from a first gate line to a second gate line adjacent to the first gate line, a portion of the pixel electrode formed to overlap a portion of the second gate line, wherein the portion of the second gate line includes a bent pattern;
   a second substrate formed to face the first substrate and including a common electrode thereon; and
   a liquid crystal layer formed between the first substrate and the second substrate.

12. The liquid crystal display as claimed in claim 11, further comprising a cutout portion formed in the common electrode, wherein
   a width of the cutout portion is less than a width of the pixel electrode,
   the cutout portion is bent to correspond to a shape of the pixel electrode, and the gate line includes a bent portion corresponding to the cutout portion.

13. The liquid crystal display as claimed in claim 12, wherein
a first side of the pixel electrode overlaps at least a portion of a drain electrode of a first data line, and
a second side of the pixel electrode, opposite the first side, overlaps at least a portion of a second data line adjacent to the first data line.

14. The liquid crystal display as claimed in claim 13, wherein at least one of the first data line and the second data line includes a protrusion which overlaps at least a portion of the pixel electrode, the protrusion comprising protruding patterns disposed along the second direction on alternating opposite sides of the at least one of the first data line and the second data line.

15. The liquid crystal display as claimed in claim 14, further comprising:
a gate insulating layer formed between at least one of the first gate line and the second gate line and at least one of the first data line and the second data line, respectively; and
a protective layer formed between the pixel electrode and at least one of the first data line and the second data line.

16. The liquid crystal display as claimed in claim 15, further comprising:
a storage electrode line formed parallel to the at least one of the first data line and the second data line in the same layer as the at least one of the first data line and the second data line; and
a storage electrode connected to the storage electrode line and which overlaps at least a portion of the pixel electrode.

17. The liquid crystal display as claimed in claim 15, further comprising a storage electrode extending from the at least one of the first gate line and the second gate line and which overlaps at least a portion of the pixel electrode.

18. The liquid crystal display as claimed in claim 17, wherein a portion of the protective layer disposed above the storage electrode is removed.

19. The liquid crystal display as claimed in claim 15, wherein the protective layer comprises at least one of an organic layer and a color filter.

20. The liquid crystal display as claimed in claim 12, wherein a width of a gap between adjacent data lines is greater than a width of a gap between the first gate line and the second gate line.

* * * * *